(12) United States Patent
Kitae et al.

(10) Patent No.: US 8,501,583 B2
(45) Date of Patent: Aug. 6, 2013

(54) METHOD FOR CONNECTING BETWEEN SUBSTRATES, FLIP-CHIP MOUNTING STRUCTURE, AND CONNECTION STRUCTURE BETWEEN SUBSTRATES

(75) Inventors: Takashi Kitae, Osaka (JP); Seiji Karashima, Osaka (JP); Susumu Sawada, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 12/497,996

(22) Filed: Jul. 6, 2009

(65) Prior Publication Data

US 2010/0007033 A1 Jan. 14, 2010

(30) Foreign Application Priority Data

Jul. 14, 2008 (JP) .................................. 2008-183051

(51) Int. Cl.
*H01L 21/30* (2006.01)
*H01L 21/4763* (2006.01)

(52) U.S. Cl.
USPC ........... 438/455; 438/108; 438/119; 438/618; 438/614; 438/758; 257/678; 257/734; 257/778; 257/783; 257/E21.551

(58) Field of Classification Search
USPC .................. 257/778, E21.511, 676, 678, 734, 257/783; 438/101, 108, 613, 118, 119, 455, 438/584, 758, 614, 618, 106, 15, 25, 125, 438/456
See application file for complete search history.

(56) References Cited

U.S. PATENT DOCUMENTS

| | | | | |
|---|---|---|---|---|
| 5,900,581 A | * | 5/1999 | Ootake | 174/523 |
| 6,002,180 A | * | 12/1999 | Akram et al. | 257/783 |
| 7,537,961 B2 | * | 5/2009 | Nakatani et al. | 438/108 |
| 2005/0287785 A1 | * | 12/2005 | Lee | 438/613 |
| 2006/0292824 A1 | * | 12/2006 | Beyne et al. | 438/455 |
| 2007/0001313 A1 | * | 1/2007 | Fujimoto et al. | 257/778 |
| 2007/0216023 A1 | | 9/2007 | Nakatani et al. | |

FOREIGN PATENT DOCUMENTS

| | | | |
|---|---|---|---|
| EP | 1865549 | * | 12/2007 |
| EP | 1873819 | * | 1/2008 |
| JP | 10-098134 | | 4/1998 |
| JP | 2002-118208 | | 4/2002 |
| JP | 2003-249603 A | | 9/2003 |
| JP | 2006-245189 A | | 9/2006 |
| WO | WO 2006/103948 A1 | | 10/2006 |

\* cited by examiner

*Primary Examiner* — Cuong Q Nguyen
*Assistant Examiner* — Galina Yushina
(74) *Attorney, Agent, or Firm* — McDermott Will & Emery LLP

(57) ABSTRACT

A resin containing a conductive particle and a gas bubble generating agent is supplied in a space between the substrates each having a plurality of electrodes. The resin is then heated to melt the conductive particle contained in the resin and generate gas bubbles from the gas bubble generating agent. A step portion is formed on at least one of the substrates. In the process of heating the resin, the resin is pushed aside by the growing gas bubbles, and as a result of that, the conductive particle contained in the resin is led to a space between the electrodes, and a connector is formed in the space. At the same time, the resin is led to a space between parts of the substrates at which the step portion is formed, and cured to fix the distance between the substrates.

11 Claims, 12 Drawing Sheets

FIG. 11

|  | Examples | | | | | | Comparative Examples | |
| --- | --- | --- | --- | --- | --- | --- | --- | --- |
|  | 1 | 2 | 3 | 4 | 5 | 6 | 1 | 2 |
| First Substrate | Circuit Board | Circuit Board | Circuit Board | Circuit Board | Circuit Board | Circuit Board | Circuit Board | Circuit Board |
| Thickness of Step Portion on First Substrate(μm) | 20 | 30 | 10 | 15 | 15 | 20 | --- | --- |
| Second Substrate | Semiconductor | Semiconductor | Circuit Board | Circuit Board | Semiconductor | Semiconductor | Semiconductor | Circuit Board |
| Thickness of Step Portion on Second Substrate(μm) | --- | 15 | 10 | 15 | 15 | --- | --- | --- |
| Distance Between Substrates(L1) (μm) | 70 | 65 | 25 | 50 | 40 | 70 | 60 | 60 |
| Distance Between Step Portions(L2) (μm) | 50 | 20 | 5 | 20 | 10 | 50 | --- | --- |

METHOD FOR CONNECTING BETWEEN SUBSTRATES, FLIP-CHIP MOUNTING STRUCTURE, AND CONNECTION STRUCTURE BETWEEN SUBSTRATES

CROSS-REFERENCE TO RELATED APPLICATIONS

This application claims priority from Japanese application JP2008-183051 filed on Jul. 14, 2008, the disclosure of which application is hereby incorporated by reference into this application in its entirety for all purposes.

BACKGROUND

The present invention relates to a method for connecting between substrates on which a plurality of electrodes are provided, a flip-chip mounting structure and a connection structure between the substrates formed by the connecting method.

In recent years, as a result of growing density of semiconductor integrated circuits (LSIs), circuit boards and electronic components, all of which are used in electronic equipment, an increase in the number of electrodes and a fine pitch of the electrodes are accelerated. Abilities of such as realizing narrow pitch, short tact time, and simultaneous formation of connectors are demanded in the process in which the electronic components are mounted.

To meet the above demand, some of the inventors of the present application disclose as a next-generation mounting method, a flip-chip mounting method using a resin which contains conductive particles and a gas bubble generating agent in WO 2006/103948.

FIG. 13A to FIG. 13D are cross-sectional views for illustrating basic steps of the flip-chip mounting method disclosed in the above publication.

As shown in FIG. 13A, a resin 105 containing conductive particles 106 and a gas bubble generating agent (not shown) is supplied into a space between a circuit board 101 having a plurality of connecting terminals 102 and a semiconductor chip 103 having a plurality of electrode terminals 104. The resin 105 is then heated and gas bubbles 110 are generated from the gas bubble generating agent contained in the resin 105 as shown in FIG. 13B. At this time, the resin 105 is pushed aside by the growing gas bubbles 110 and self-assembled in a space between the connecting terminals 102 and the electrode terminals 104 as shown in FIG. 13C. After that, connectors 107 are formed in the space between the terminals 102 and 104 by further heating the resin 105 and melting the conductive particles 106 contained in the resin 105 which is self-assembled in the space between the terminals 102 and 104 as shown in FIG. 13D. A flip-chip mounting structure in which the terminals 102 and 104 are electrically connected through the connectors 107 is obtained in this way. This method can also be used in, for example, connecting between substrates on which electronic components are mounted.

SUMMARY

In the above method, the resin 105 is encouraged to move into a space between the terminals 102 and 104 by the growing gas bubbles 110 generated from the gas bubble generating agent. The above method is thus suitable for connecting between narrow-pitch terminals. The resin 105 led to the space between the terminals can remain stable in the space between the terminals due to surface tension. Moreover, the conductive particles 106 contained in the resin 105 which is self-assembled in the space between the terminals are melted, and thus, can wet spread over surfaces of the terminals. As a result, stable connectors 107 can be formed between the terminals.

In the above method, it is preferable that the resin 105 which is not self-assembled in the space between the terminals is pushed out to a periphery of the circuit board 101 and the semiconductor chip 103 (hereinafter both referred to simply as "substrates") where there is no terminal formed. However, the resin 105 may remain in a space between the substrates that is not sandwiched between the terminals. In that case, in which space between the substrates the resin 105 remains may affect the reliability of the flip-chip mounting structure (or electronic component mounting structure).

For example, if the resin 105 remains in a space adjacent to the space between the terminals in which the connector 107 are formed, poor insulation may occur between the connectors 107 due to ion migration caused by an impurity contained in the resin 105, depending on the composition of the resin 105.

Moreover, if the resin 105 pushed out to the periphery of the substrate serves as if it were a sealing material and forms an enclosed space between the substrates as shown in FIG. 13D, the gas bubbles generated in the resin 105 remain in the enclosed space. In that case, steam explosion or the like of the moisture accumulated in the gas bubbles 110 may occur due to reheating at the time of secondary mounting of the flip-chip mounting structure onto another circuit board or the like, and result in causing connection failure.

In the above method, no consideration is given to where in between the substrates the resin 105 remains after pushed out into a space not sandwiched between terminals when the resin 105 is made to come self-assembled in the space between the terminals.

The present invention was made in view of the above. The present invention may be used in a method in which substrates are electrically connected by letting conductive particles contained in a resin come self-assembled between terminals and forming connectors between the terminals, and may be advantageous in providing a method for connecting between substrates that is capable of achieving a highly reliable mounting structure by controlling the resin pushed out into a space not sandwiched between the terminals to be led to a given space.

This summary is provided to introduce a selection of concepts in a simplified form that are further described below in the Detailed Description. It is not intended to identify key features of the claimed subject matter, nor is it intended to be used as an aid in determining the scope of the claimed subject matter.

The invention disclosed and claimed herein, in one aspect thereof, is characterized in that, in a method for connecting between substrates, a step portion is formed at a given part of the substrates where no electrode is formed and a resin which contains conductive particles and a gas bubble generating agent is supplied between the substrates and is heated to a temperature at which the conductive particles melt, to make the resin come self-assembled between the electrodes and form connectors between the electrodes.

According to the above method, the resin is heated to generate gas bubbles from the gas bubble generating agent contained in the resin, and the resin is pushed aside by the gas bubbles. Due to these gas bubbles, the resin is led to a space between the electrodes or a space between parts of the substrates at which the step portion is formed (narrow space). Melted conductive particles contained in the resin led to the space between the electrodes wet spread over surfaces of the electrodes, and connectors are formed between the electrodes. On the other hand, the gas bubbles generated in the resin are led to the space between the electrodes or a space between parts of the substrates at which no step portion is formed (wide space). The resin led to the space between the electrodes is expelled from the space between the electrodes as the connectors are built between the electrodes, and is more led to the space between parts of the substrates at which the step portion is formed.

In other words, the resin is led to a narrow space, i.e., the space between the electrodes or the space between parts of the substrates at which the step portion is formed, due to capillarity. However, conductive particles are more led to the space between electrodes due to wettability. As a result, the resin is led to the space between parts of the substrates at which the step portion is formed in a contradictory manner. Gas bubbles, on the other hand, are more led to the space between the electrodes or the wide space between parts of the substrates at which no step portion is formed, due to surface tension. By utilizing these characteristics, the resin, the conductive particles, and the gas bubbles are controlled to be led to their respective spaces between the substrates.

A method for connecting between substrates according to the present invention is one in which a first substrate having a plurality of first electrodes is located so as to face a second substrate having a plurality of second electrodes and in which the first electrodes and the second electrodes are electrically connected to each other through connectors, the method including: supplying a resin containing a conductive particle and a gas bubble generating agent to a space between the first substrate and the second substrate; heating the resin to melt the conductive particle contained in the resin and generate gas bubbles from the gas bubble generating agent contained in the resin; and curing the resin, wherein a step portion is formed on at least one of the first substrate and the second substrate, in the step of heating resin, the resin is pushed aside by the growing gas bubbles, so that the melted conductive particle contained in the resin is led to a space between the first electrodes and the second electrodes and that the connectors made of the melted conductive particle are formed in the space between the electrodes, and the resin is led to a space between part of the first substrate and part of the second substrate at which the step portion is formed, and in the step of curing resin, the first substrate and the second substrate are fixed to each other by the cured resin.

According to a preferred embodiment, in the step of heating resin, a first hollow part is formed at least in a space between the first substrate and the second substrate that is not sandwiched between the electrodes as a result of the resin being pushed out by the gas bubbles.

According to a preferred embodiment, the plurality of first electrodes and the plurality of second electrodes are arranged in an array on the first substrate and the second substrate, respectively, and the step portion has a ring shape so as to surround an area where the electrodes are arranged in an array.

According to a preferred embodiment, an opening is formed in part of the ring-shaped step portion, and as a result of the resin being pushed out by the gas bubble, a second hollow part is formed in a space between part of the first substrate and part of the second substrate at which the ring-shaped step portion has the opening, and the first hollow part communicates with the outside through the second hollow part.

According to a preferred embodiment, the plurality of first electrodes and the plurality of second electrodes have a linear shape and are arranged in parallel with each other, and the step portion is placed outside an area where the linear-shaped electrodes are located, so as to be parallel with the linear-shaped electrodes.

According to a preferred embodiment, the plurality of first electrodes and the plurality of second electrodes have a linear shape and are arranged in parallel with each other, and the step portion is placed so as to be orthogonal to the linear-shaped electrodes.

According to a preferred embodiment, the step portion is made of a material whose wettability to the melted conductive particle is lower than wettability of a material for the first electrodes and the second electrodes to the melted conductive particle.

According to a preferred embodiment, a distance between part of the first substrate and part of the second substrate at which the step portion is formed is smaller than an average particle diameter of the conductive particle.

According to a preferred embodiment, a distance between part of the first substrate and part of the second substrate at which the step portion is formed is half or smaller than a distance between part of the first substrate and part of the second substrate at which the step portion is not formed.

According to a preferred embodiment, a gas bubble generating source for generating gas bubbles is included in at least one of the first substrate and the second substrate instead of including the gas bubble generating agent in the resin, and in the step of heating resin, the gas bubbles are generated from the gas bubble generating source.

According to a preferred embodiment, the first substrate and the second substrate are a circuit board or a semiconductor chip.

A flip-chip mounting structure according to the present invention is one in which a semiconductor chip is mounted on a circuit board, wherein an electrode formed on the circuit board and an electrode formed on the semiconductor chip are electrically connected to each other through a connector by using the method of claim 1.

A connection structure between substrates according to the present invention is one in which circuit boards each having a plurality of electrodes are electrically connected to each other, wherein the circuit boards are electrically connected through connectors formed in a space between the electrodes, by using the method of claim 1.

A connection structure between substrates according to the present invention is one in which a first substrate having a plurality of first electrodes is located so as to face a second substrate having a plurality of second electrodes and in which the first and second electrodes are electrically connected to each other through connectors made of a metal, wherein a step portion is formed on at least one of the first substrate and the second substrate, and the first substrate and the second substrate are bonded to each other with a resin on the step portion, and a space between the first substrate and the second substrate that is not sandwiched between the first and second electrodes is a hollow part.

According to a preferred embodiment, at least part of the hollow part communicates with the outside.

According to a preferred embodiment, the step portion formed on at least one of the first substrate and the second substrate is located in a periphery of the substrates.

According to a preferred embodiment, surfaces of the first and second electrodes have higher wettability to a metal and lower wettability to a resin than a surface of the step portion.

According to a preferred embodiment, a distance between part of the first substrate and part of the second substrate at which the step portion is formed is smaller than a distance between part of the first substrate and part of the second substrate at which the first and second electrodes are formed.

A flip-chip mounting structure according to the present invention is one in which a semiconductor chip having a plurality of first electrodes is located so as to face a substrate having a plurality of second electrodes and in which the first and second electrodes are electrically connected to each other through connectors, wherein a step portion is formed on at least one of the semiconductor chip and the substrate, and the semiconductor chip and the substrate are bonded to each other with a resin on the step portion, and a space between the semiconductor chip and the substrate that is not sandwiched between the first and second electrodes is a hollow part.

According to a preferred embodiment, at least part of the hollow part communicates with the outside.

According to a preferred embodiment, the plurality of first electrodes and the plurality of second electrodes are arranged in an array on the semiconductor chip and the substrate, respectively, and the step portion has a ring shape so as to surround an area where the electrodes are arranged in an array, and an opening is formed in part of the ring-shaped step portion.

According to the present invention, a step portion is formed at a part on the substrates where no electrode is formed, and a resin which contains conductive particles and a gas bubble generating agent is supplied to a space between the substrates and is heated to a temperature at which the conductive particles melt to form connectors between the electrodes and electrically connect between the substrates through the connectors. Further, the connectors can be electrically insulated from one another by a hollow part which is formed in a space between the substrates that is not sandwiched between electrodes, and the distance between the substrates can be fixed by the resin formed in the space between parts of the substrates at which the step portion is formed. Due to this structure, a highly reliable connection between the substrates can be achieved even if a pitch between the electrodes is narrow.

BRIEF DESCRIPTION OF THE DRAWINGS

FIG. 2A is a plan view. FIG. 2B is a cross-sectional view taken along the line IIb-IIb of FIG. 2A. FIG. 2C is a cross-sectional view taken along the line IIc-IIc of FIG. 2A.

FIG. 4 A to FIG. 4C illustrate a method for connecting between substrates according to a modification of Embodiment 1 of the present invention.

FIG. 5A is an oblique view. FIG. 5B is a cross-sectional view taken along the line Vb-Vb of FIG. 5A. FIG. 5C is a cross-sectional view taken along the line Vc-Vc of FIG. 5A.

FIG. 6A is an oblique view. FIG. 6B is a cross-sectional view taken along the line VIb-VIb of FIG. 6A. FIG. 6C is a cross-sectional view taken along the line VIc-VIc of FIG. 6A.

FIG. 7A is an oblique view. FIG. 7B is a cross-sectional view taken along the line VIIb-VIIb of FIG. 7A. FIG. 7C is a cross-sectional view taken along the line VIIc-VIIc of FIG. 7A.

FIG. 9 is a plan view. FIG. 9B is a cross-sectional view taken along the line IXb-IXb of FIG. 9A.

FIG. 11 is a table that indicates major structural conditions for the mounting structures in each example of the present invention and comparative examples.

FIG. 12A is a cross-sectional view of the mounting structure. FIG. 12B is an X-ray photograph of a cross section of a part of the mounting structure that is pointed by the arrow A in FIG. 12A. FIG. 12C is an X-ray photograph of a cross section of a part of the mounting structure that is pointed by the arrow B in FIG. 12A.

DETAILED DESCRIPTION

Figure 1A:
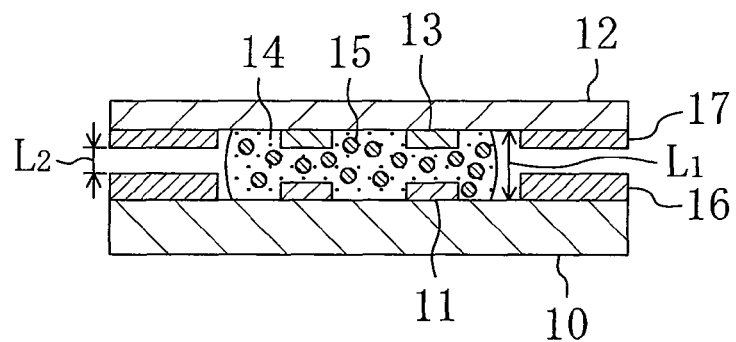
FIG. 1A to FIG. 1D show cross-sectional views for illustrating steps of a method for connecting between substrates according to Embodiment 1 of the present invention.

Embodiments of the present invention are hereinafter described, with reference made to the drawings. In the following drawings, structural elements having substantially the same function are labeled with the same reference character for simplification of description. The present invention is not limited to the embodiments below.

Embodiment 1

FIG. 1A to FIG. 1D show cross-sectional views for illustrating steps of a method for connecting between substrates according to Embodiment 1 of the present invention.

Referring to FIG. 1A, a resin 14 containing conductive particles 15 and a gas bubble generating agent (not shown) is supplied to a first substrate 10 having a plurality of first electrodes 11. Then, a second substrate 12 having a plurality of second electrodes 13 is located. Here, the distance between part of the first substrate 10 and part of the second substrate 12 at which no electrodes 11 and 13 are formed is referred to as $L_1$.

Step portions 16 and 17 are provided on the first substrate 10 and the second substrate 12, respectively, so as to face each other. The distance $L_2$ between the step portions 16 and 17 is smaller than $L_1$. The step portions 16 and 17 may be provided on one of the first substrate 10 and the second substrate 12. The resin 14 does not have to be selectively applied on the electrodes 11, but may be uniformly applied on the first substrate 10.

Figure 1B:
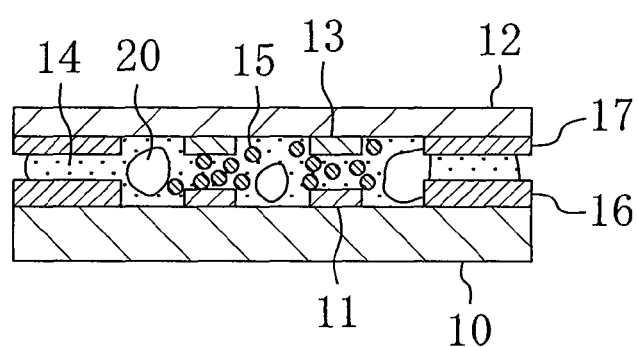

Referring to FIG. 1B, the resin 14 is heated to melt the conductive particles 15 contained in the resin 14 and generate gas bubbles 20 from the gas bubble generating agent. In stead of adding the gas bubble generating agent in the resin 14, a gas bubble generating source, for example, may be included in the substrates to generate the gas bubbles 20 from the gas bubble generating source. As the gas bubble generating source, a moisture and evaporative gas generating agent, which generates gas bubbles when heated (e.g., butyl carbitol), can be included in the substrates beforehand. Decomposition-type gas generating agents which generate gas bubbles when decomposed by heat (e.g., aluminium hydroxide and calcium aluminate) may also be used in the substrates.

The gas bubbles 20 gather in a wide space because of the surface tension. Specifically, the gas bubbles 20 tend to gather in the space between the substrates having the distance $L_1$ (wide space). Due to the gas bubbles 20, the resin 14 containing the melted conductive particles 15 is led to a space between the electrodes 11 and 13 (narrow space) and self-assembled. If the conductive particles are a metal particle such as a solder powder, the melted particles 15 wet spread over the surfaces of the electrodes 11 and 13.

Figure 1C:
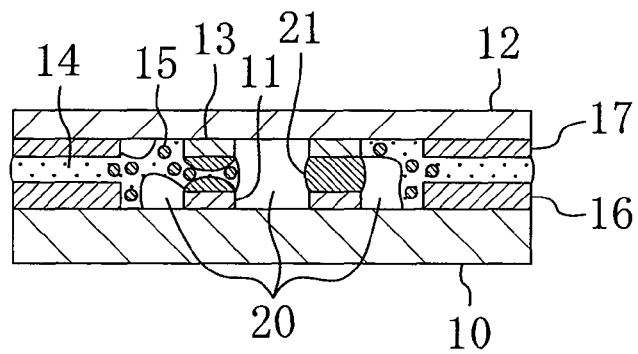

Connectors 21 are formed as the conductive particles wet spread over the surface of the electrodes, and the connectors 21 electrically connect between the first electrodes 11 and the second electrodes 13 as shown in FIG. 1C. On the other hand, the resin 14 is expelled from the space between the electrodes 11 and 13 as the connectors 21 are built between the electrodes 11 and 13.

Figure 1D:
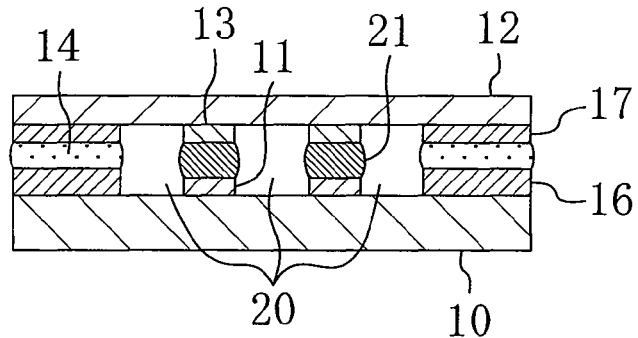

The gas bubbles 20 are generated and the connectors 21 are formed while these processes are repeated. Most of the resin 14 that is expelled from the space between the electrodes 11 and 13 is led, due to capillarity, to the space between the substrates having the distance $L_2$ (i.e., the space between the step portions 16 and 17) which is smaller than the space between the substrates having the distance $L_1$ while being pushed aside by the growing gas bubbles 20, as shown in FIG. 1D. Lastly, the resin 14 led to the space between the step portions 16 and 17 is cured, thereby fixing the distance between the substrates 10 and 12.

As a result of these processes, the connectors 21, the resin 14, and the gas bubbles 20 are selectively formed between the electrodes 11 and 13, the step portions 16 and 17, and the substrate 10 and 12, respectively, and the connection between the substrate 10 and 12 is completed.

In the connection structure between the substrates obtained by the above method, the space between the substrates 10 and 12 that is not sandwiched between the electrodes 12 and 13 is a hollow, and the resin 14 does not remain near the connectors 21. Poor insulation between the connectors 21 due to ion migration can thus be prevented. In other words, higher priority can be placed on the adhesion strength and other properties than on the insulation reliability as characteristics of a material for the resin 14, and this increases the options for the materials for the resin 14. Further, the adhesion between the substrates 10 and 12 can be ensured because the substrates 10 and 12 are bonded to each other with the resin in the space between the step portions 16 and 17.

In the present invention, the space between the substrates that is not sandwiched between the electrodes does not necessarily mean the entire space between the substrates that is not sandwiched between electrodes, and the resin 14 may remain in part of the space without reducing the effect of preventing poor insulation due to ion migration.

In the present invention, the resin 14 does not need to be provided in all of the spaces between parts of the substrates 10 and 12 at which the step portions 16 and 17 are formed, and does not need to be provided on the entire surfaces of the step portions 16 and 17.

Since the resin 14 which connects between the substrates 10 and 12 is led to the small space between the step portions 16 and 17 having the distance $L_2$, the resin 14 can be formed thin (e.g., 50 μm or less). Thus, cohesion failure in the resin 14 (failure within the resin 14, not a separation at an interface of the resin 14) is not apt to occur, compared to the case where the step portions 16 and 17 are not provided, and the adhesion strength can be more increased. In other words, higher priority can be placed on the insulation reliability or other properties than on the adhesion strength as characteristics of a material for the resin 14, and this increases the options for the materials for the resin 14.

It is preferable that the distance between parts of the first substrate 10 and the second substrate 12 at which the step portions 16 and 17 are formed (i.e., the thickness of the resin 14) is smaller than the distance between parts of the first substrate 10 and the second substrate 12 at which the first and second electrodes 11 and 13 are formed (i.e., the thickness of the connector 21). This structure can increase the adhesion strength of the resin 14.

In general, it is expected that the adhesion strength is reduced if the resin 14 includes solid substances such as a filler. However, the adhesion strength of the resin 14 can be ensured even if such the substances are included in the resin 14, and thus, a filler can be added in the resin 14. In the case where a filler is added, it is preferable that the average particle diameter of the filler is equal to or smaller than the distance $L_2$ between the step portions 16 and 17. This enables the resin 14 containing the filler to be led to a space between the step portions 16 and 17. For example, inorganic fillers such as alumina may be added for the purpose of reducing a coefficient of linear expansion, or metal fillers such as copper, nickel, and carbon may be added for the purpose of EMC sealing. As a material for the metal fillers, materials whose melting point is higher than the melting point of the conductive particles 15 are preferable. This enables the conductive particles 15 to be self-assembled in the space between the electrodes 11 and 13, and the resin 14 containing the metal filler to be led to the space between the step portions 16 and 17. Even if a metal filler is contained in the space between the electrodes 11 and 13, it does not cause any problem.

Moreover, according to the method of the present invention, the adhesion strength can be ensured even in the case where an electronic component made of a material having weak adhesion properties to a polyimide substrate is mounted on a polyimide substrate. Sufficient adhesion strength can be ensured by choosing, as a material for the step portions 16 and 17, a material having strong adhesion properties to the polyimide substrate, without selecting a material which increases the adhesion to the polyimide resin as a material for the resin 14. In other words, higher priority can be placed on properties other than the adhesion strength as characteristics of a material for the resin 14, and this increases the options for the materials for the resin 14.

Figure 2A:
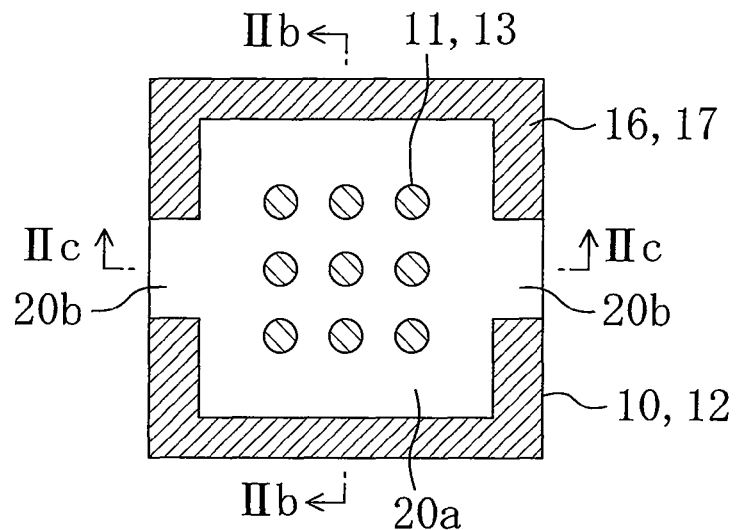
FIG. 2A to FIG. 2C illustrate a method for connecting between the substrates according to Embodiment 1 of the present invention.
Figure 2B:
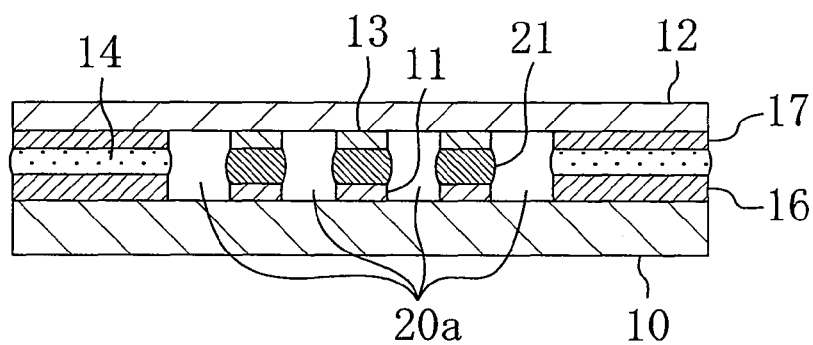
Figure 2C:
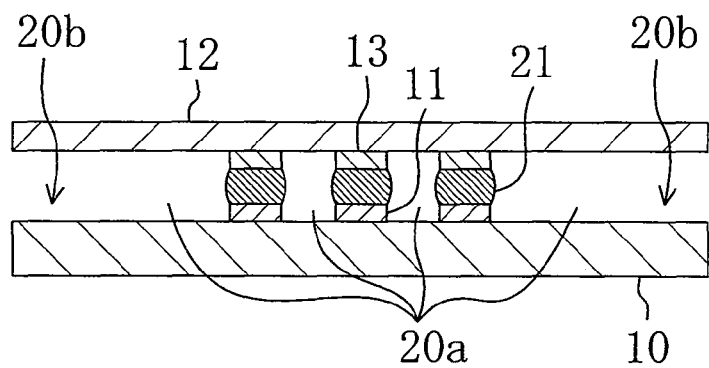

FIG. 2 shows a method for connecting between the substrates having the plurality of electrodes 11 and 13 arranged in an array. FIG. 2A is a plan view. FIG. 2B is a cross-sectional view taken along the line IIb-IIb of FIG. 2A. FIG. 2C is a cross-sectional view taken along the line IIc-IIc of FIG. 2A.

Referring to FIG. 2A, ring-shaped step portions 16 and 17 are provided such that they surround the electrodes 11 and 13 arranged in an array. Openings are formed at parts of the step portions 16 and 17. A hollow part 20b is formed in the space between parts of the substrates 10 and 12 at which the step portions 16 and 17 have the openings. The resin 14 is pushed out through the hollow part 20b by the gas bubbles 20. The space between the substrates 10 and 12 that is not sandwiched between the electrodes 11 and 13 is referred to as a hollow part 20a, which communicates with the outside through the hollow part 20b.

Due to this structure, superior quality in terms of moisture/reflow reliability can also be ensured. Specifically, moisture is not likely to be retained because the hollow part 20a formed between the substrates 10 and 12 communicates with the outside, and air pressure increases less because the moisture evaporated at rapid heating can escape to the outside. As a result, poor connection can be prevented.

The hollow part 20a formed between the substrates 10 and 12 does not have to be a continuous one, but at least part of the hollow part 20a may communicate with the outside through the hollow part 20b. Whether the flip-chip mounting structure has sufficient moisture/reflow reliability greatly varies according to how much of the continuous hollow part 20a communicates with the outside, and according to vapor permeance of the resin 14 and adhesion strength. Therefore, how much of the hollow part 20a is to be connected to the hollow part 20b can be appropriately decided based on the forms of applications and testing conditions. It is more preferable that the entire hollow part 20a communicates with the outside, particularly in terms of such as moisture/reflow reliability. Insulation reliability is also improved because the hollow part 20a between the substrates 10 and 12 contributes to reduce adsorption of condensation and moisture, and a result of that, moisture is not likely to be retained.

Figure 3:
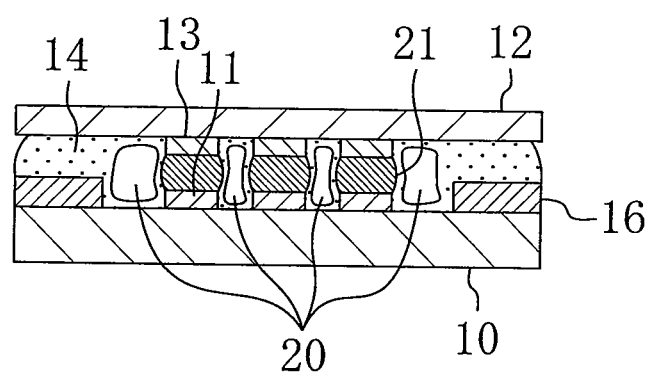
FIG. 3 shows a connection structure between substrates according to a modification of Embodiment 1 of the present invention.

In the present invention, the step portion may be provided on one of the first substrate 10 and the second substrate 12 as shown in FIG. 3 (FIG. 3 shows the example in which the step portion 16 is provided on the first substrate 10). The effect of preventing poor insulation due to ion migration is not reduced even if the resin 14 remains in part of the hollow part 20 formed in the space between the substrates 10 and 12 that is not sandwiched between the electrodes 11 and 13.

The step portions 16 and 17 are provided around the peripheries of the substrates 10 and 12, and thus, the resin 14 led to a space between the step portions 16 and 17 can function as a shock absorber. Hence, even if the connection structure between the substrates receives a shock, the shock is absorbed by the resin 14 around the peripheries of the substrates 10 and 12. The connection structure is therefore highly reliable.

Figure 4A:
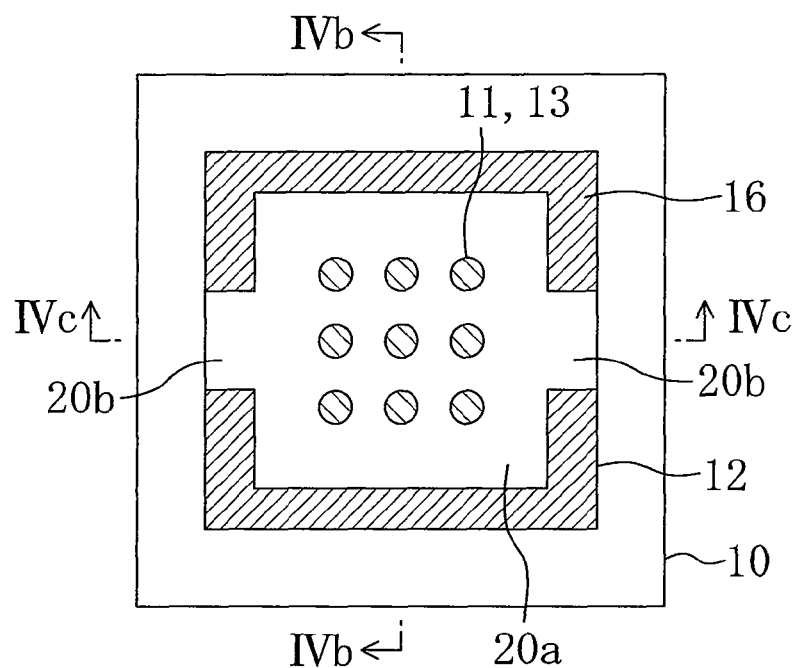
FIG. 4A is a plan view.
Figure 4B:
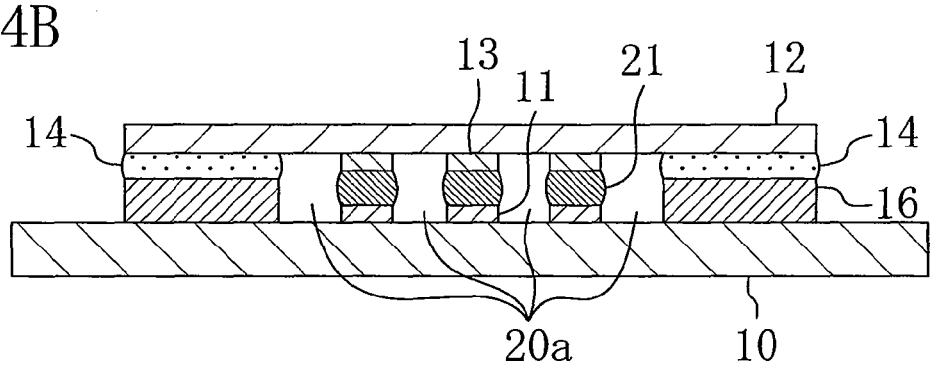
FIG. 4B is a cross-sectional view taken along the line IVb-IVb of FIG. 4A.
Figure 4C:
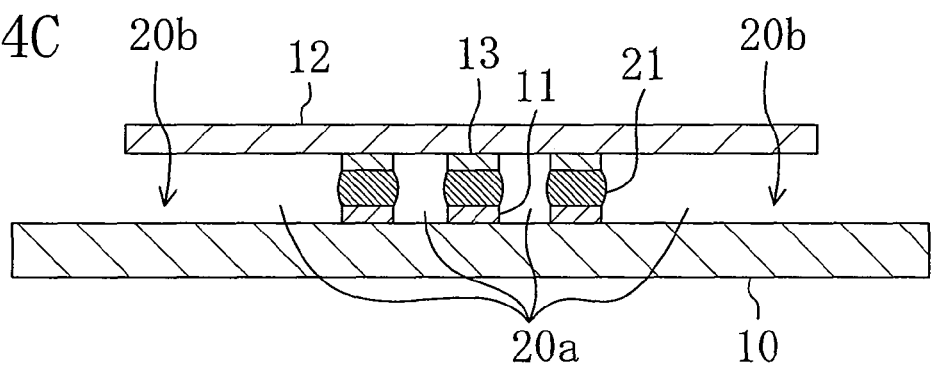
FIG. 4C is a cross-sectional view taken along the line IVc-IVc of FIG. 4A.

In the present invention, the first substrate 10 and the second substrate 12 do not have to have the same size as shown in FIG. 2A to FIG. 2C. For example, the first substrate 10 may be bigger than the second substrate 12 as shown in FIG. 4A to FIG. 4C. FIG. 4A is a plan view of the connection structure between the substrates. FIG. 4B is a cross-sectional view taken along the line IVb-IVb of FIG. 4A. FIG. 4C is a cross-sectional view taken along the line IVc-IVc of FIG. 4A. In this example, the step portion 16 is provided on only the first substrate 10 as shown in FIG. 4B.

In the case where the step portions 16 and 17 are provided on both of the substrates 10 and 12, the step portions 16 and 17 do not necessarily have to have the same height. The step portions 16 and 17 may be formed beforehand by providing a resist and a cover lay at given parts on the substrates 10 and 12. Alternatively, a film-type resin (a B-stage resin or cured resin film), a liquid-type resin (such as a thermosetting resin), a plate-type inorganic material (such as ceramic and metal materials), etc. may be provided at the time of mounting. In this case, materials which adhere to the first substrate 10 or the second substrate 12 at the time of heating the resin 14 may be selected as materials for the step portions 16 and 17. Kinds of materials for the step portions 16 and 17 do not necessarily have to be the same.

It is preferable that the distance $L_2$ between the step portions 16 and 17 is half or smaller than the distance $L_1$ between parts of the substrates at which the electrodes 11 and 13 are not formed. In this structure, the resin 14 is more likely to be led to a space between the step portions 16 and 17. Further, it is preferable that the distance $L_2$ is smaller than the average particle diameter of the conductive particles 15. In this structure, the conductive particles 15 are more unlikely to be led into the space between the step portions 16 and 17, and as a result, more likely to be self-assembled to the space between the electrodes 11 and 13. It does not matter if some conductive particles 15 are included in the resin 14 in the space between the step portions 16 and 17.

Techniques for supporting the first substrate 10 and the second substrate 12 and maintaining the given distances $L_1$ and $L_2$ include the methods in which the substrates 10 and 12 are mechanically sucked or grabbed, or particles having a uniform diameter or linear substances are put in between part of the substrates 10 and 12.

A solder powder, for example, can be used as the conductive particles 15 of the present invention. The solder powder may be, but not limited to, a conventional lead-containing solder such as SnPb, or a lead-free solder such as SnAgCu, SnAg, SnAgBiIn, SnSb, and SnBi. The size of the solder powder is not limited, too, but the solder powder whose average particle diameter is approximately 1 μm to 50 μm is preferable. The wettability of the conductive particles 15 to the first electrode 11 and the second electrode 13 is higher than the wettability of the conductive particles 15 to the first substrate 10 and the second substrate 12.

As a material for the resin 14 of the present invention, a thermosetting resin (e.g., epoxy resin, phenol resin, silicone resin, and melamine resin), a thermoplastic resin (e.g., polyamide, polycarbonate, polyethylene terephthalate, poly phenylene sulfide), etc. can be used. If the process includes a cleaning process, materials such as silicon oil, group of glycerin, and hydrocarbon oil may be used as the resin 14.

The first substrate 10 and the second substrate 12 of the present invention are not specifically limited as long as they are substrates having an approximately flat surface, such as circuit boards, semiconductor chips, module components, and passive elements. For example, a circuit board and a semiconductor chip may be bonded to each other to obtain a flip-chip mounting structure. A circuit board may be bonded to another circuit board to obtain a connection structure between the substrates.

Shapes of the first electrode 11 and the second electrode 13 of the present invention are not specifically limited. The first electrode 11 and the second electrode 13 may have round and linear shapes, for example. Kinds of the electrodes 11 and 13 are not specifically limited. For example, gold, silver, copper, solder and palladium may be used. The conductive particles 15 have good wettability to these materials, and thus, the conductive particles 15 are more encouraged to be self-assembled between the electrodes 11 and 13.

The term "self-assembled" for the conductive particles 15 in the present embodiment is used to describe the situation in which the resin 14, in which the conductive particles 15 are uniformly dispersed, is uniformly supplied to a space between the substrates 10 and 12, including a space between the electrodes 11 and 13, and the resin 14 is heated to generate the gas bubbles 20, by which the conductive particles 15 are led to the space between the electrodes 11 and 13, and the connectors 21 are formed as a result.

Embodiment 2

Figure 5A:
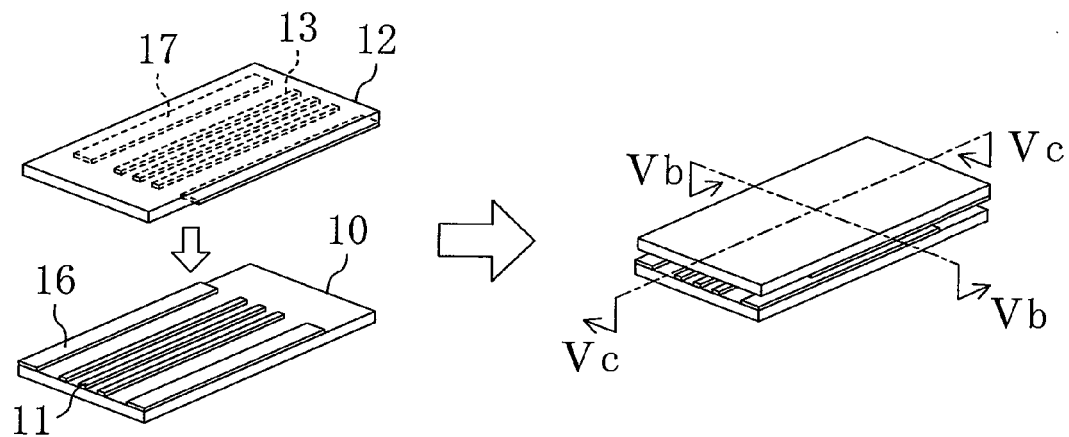
FIG. 5A to FIG. 5C illustrate a method for connecting between substrates according to Embodiment 2 of the present invention.
Figure 5B:
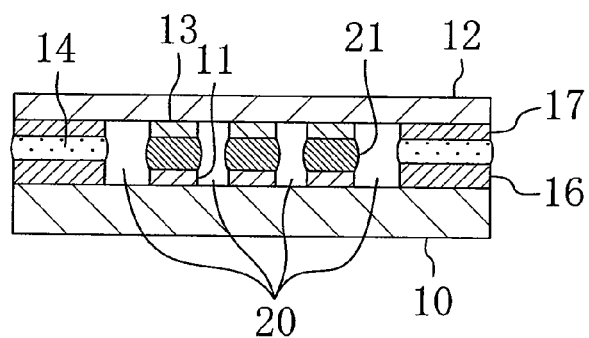
Figure 5C:
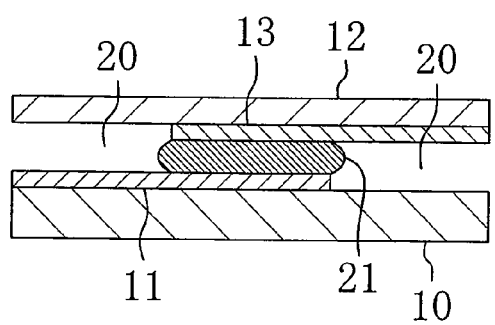

FIG. 5 shows a method for connecting between substrates according to Embodiment 2 of the present invention. FIG. 5A is an oblique view. FIG. 5B is a cross-sectional view taken along the line Vb-Vb of FIG. 5A. FIG. 5C is a cross-sectional view taken along the line Vc-Vc of FIG. 5A. In the present embodiment, structural elements identical with those of Embodiment 1 are labeled with the same characters. Unless otherwise stated, the present embodiment is the same as Embodiment 1, and the detailed description thereof is omitted.

Referring to FIG. 5A, a plurality of linear electrodes 11 (first electrodes) are formed on the first substrate 10, and the step portion 16 is provided outside the first electrodes 11 so as to be in parallel with the first electrodes 11. Similarly, a plurality of linear electrodes 13 (second electrodes) are formed on the second substrate 12, and the step portion 17 is provided outside the second electrodes 13 so as to be in parallel with the second electrodes 13.

In the present embodiment, as shown in FIG. 5B, the first substrate 10 and the second substrate 12 are electrically connected to each other through the connectors 21 formed in spaces between the linear electrodes 11 and 13, and at the same time, mechanically bonded to each other by the resin 14 led to the space between the linearly-extending step portions 16 and 17.

The present embodiment can be applied, for example, to the connection structure between substrates in which a circuit board is electrically connected to another circuit board. As shown in FIG. 5B, the connectors 21 formed in the spaces between the electrodes 11 and 13 are insulated from one another by the hollow part 20 formed in a space between the substrates 10 and 12 that is not sandwiched between electrodes 11 and 13. This achieves superior insulation. Moreover, as shown in FIG. 5C, moisture is not likely to be retained because the hollow part 20 communicates with the outside, and air pressure increases less because the moisture evaporated at rapid heating can escape to the outside. As a result, poor connection can be prevented.

Figure 6A:
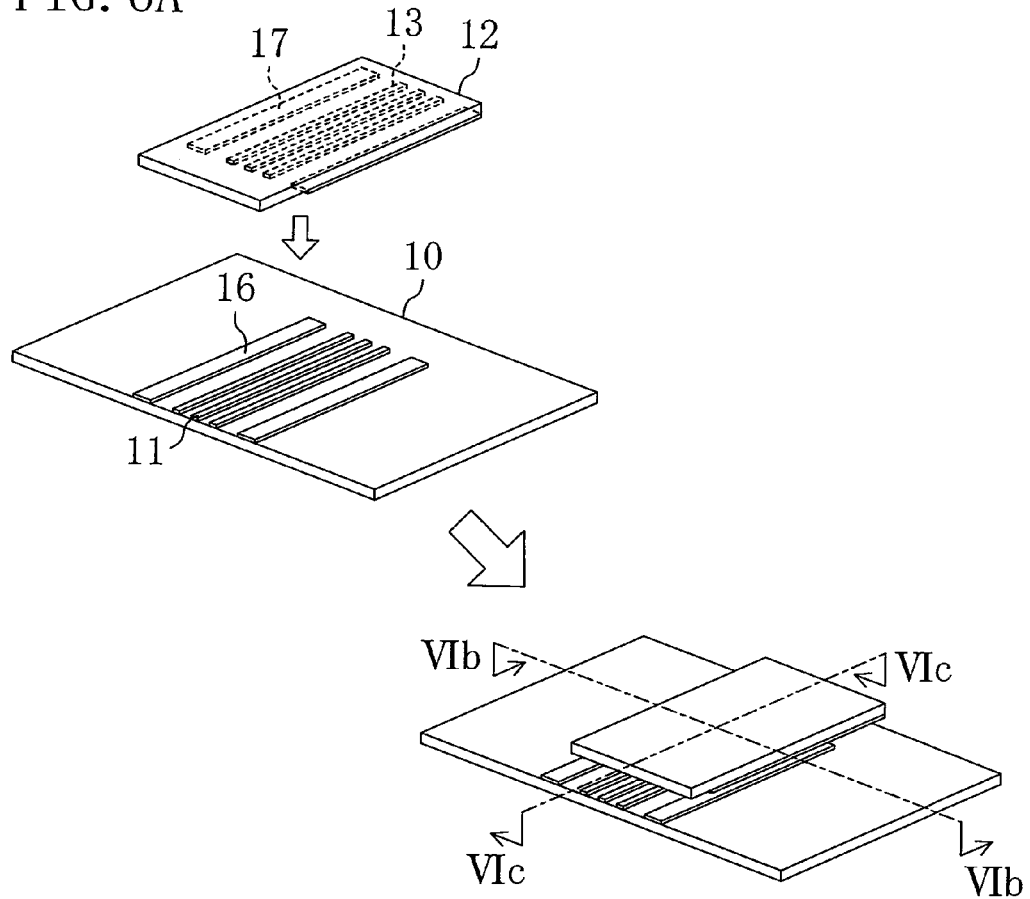
FIG. 6A to FIG. 6C illustrate a method for connecting between substrates according to a modification of Embodiment 2 of the present invention.
Figure 6B:
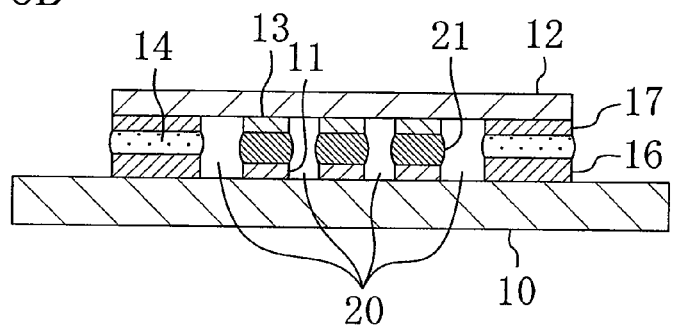
Figure 6C:
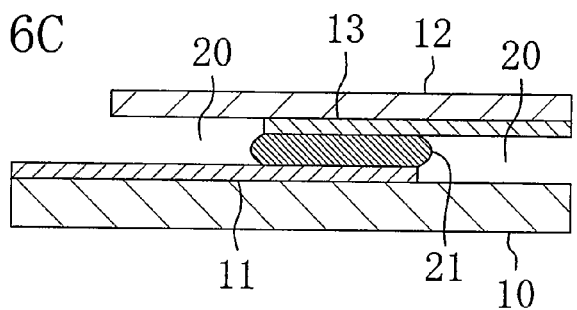

In the present embodiment, the first substrate 10 and the second substrate 12 do not have to have the same size as shown in FIG. 5A to FIG. 5C. For example, the first substrate 10 may be bigger than the second substrate 12 as shown in FIG. 6A to FIG. 6C. FIG. 6A is an oblique view of the connection structure between the substrates. FIG. 6B is a cross-sectional view taken along the line VIb-VIb of FIG. 6A. FIG. 6C is a cross-sectional view taken along the line VIc-VIc of FIG. 6A.

Figure 7A:
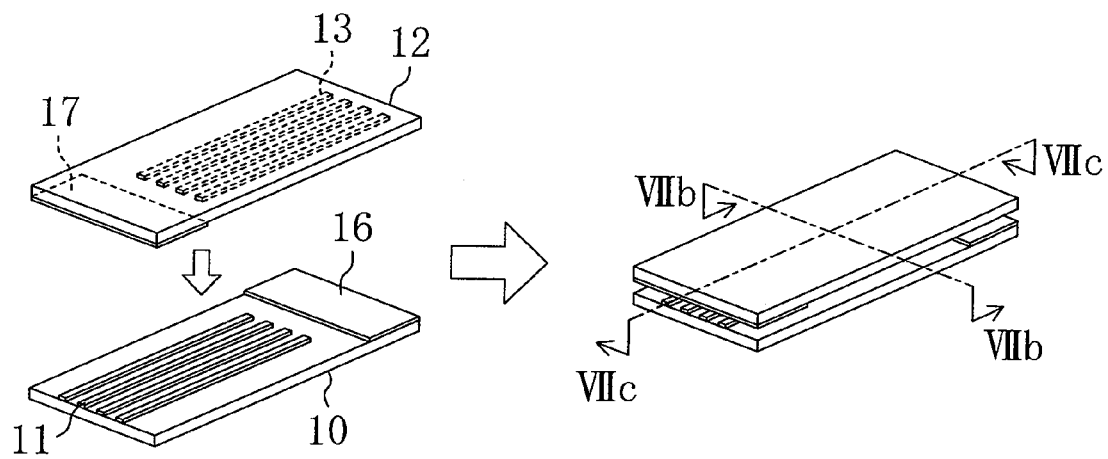
FIG. 7A to FIG. 7C illustrate a method for connecting between substrates according to a modification of Embodiment 2 of the present invention.
Figure 7B:
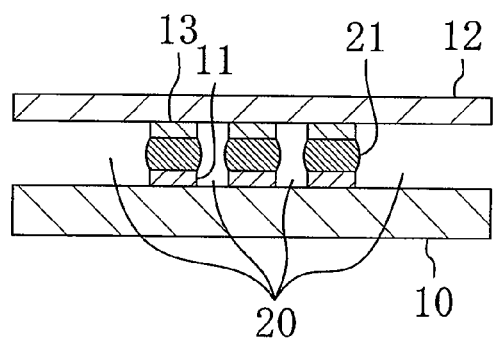
Figure 7C:
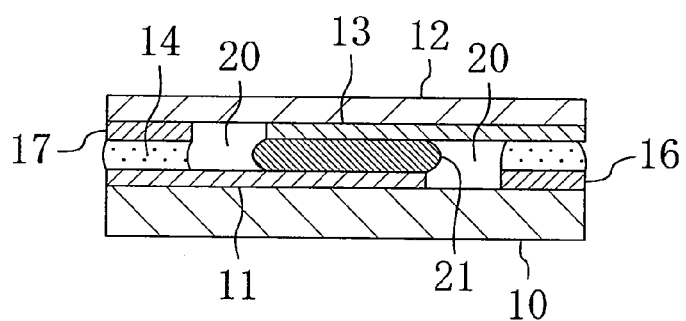

In the present embodiment, the step portions 16 and 17 may be orthogonal to the linearly-extending first and second electrodes 11 and 13, as shown in FIG. 7A to FIG. 7C.

Figure 8A:
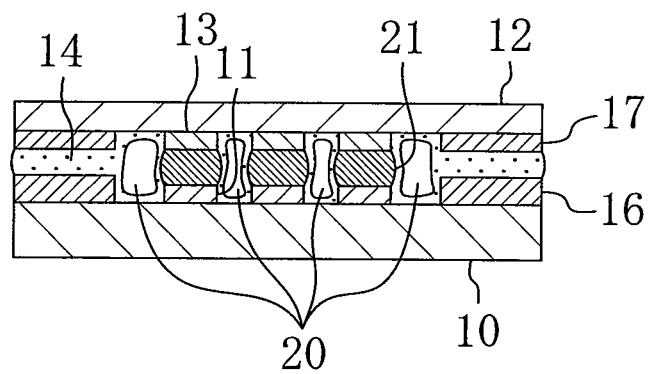
FIG. 8A and FIG. 8B show cross-sectional views for illustrating a method for connecting between substrates according to a modification of Embodiment 2 of the present invention.
Figure 8B:
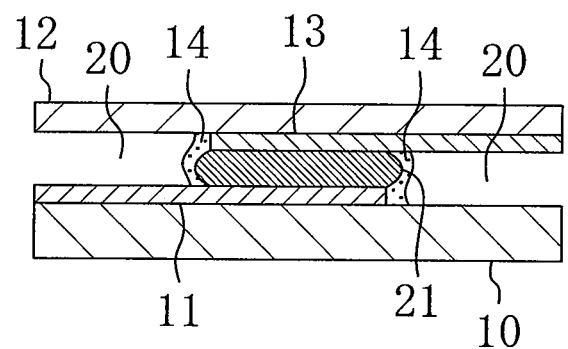

Moreover, as shown in FIG. 8A and FIG. 8B, the effect of preventing poor insulation due to ion migration is not reduced even if the resin 14 remains in part of the hollow part 20 formed in a space between the substrates 10 and 12 that is not sandwiched between the electrodes 11 and 13.

Embodiment 3

Figure 9A:
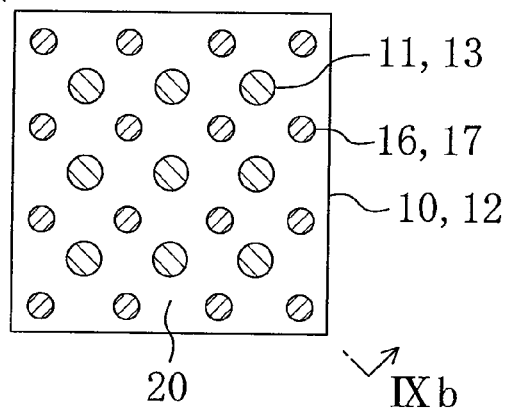
FIG. 9A and FIG. 9B illustrate a method for connecting between substrates according to Embodiment 3 of the present invention.
Figure 9B:
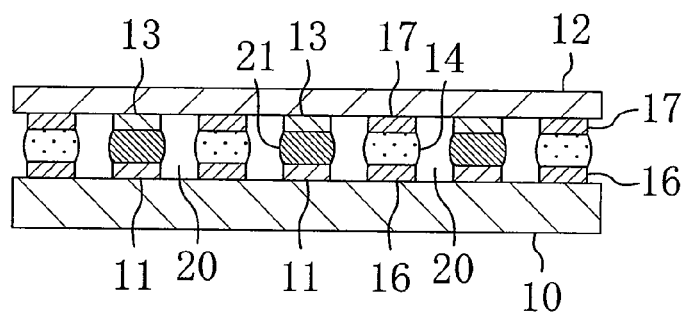

FIG. 9 shows a method for connection between substrates according to Embodiment 3 of the present invention. FIG. 9A is a plan view. FIG. 9B is a cross-sectional view taken along the line IXb-IXb of FIG. 9A. In the present embodiment, structural elements identical with those of Embodiment 1 are labeled with the same characters. Unless otherwise stated, the present embodiment is the same as Embodiment 1, and the detailed description thereof is omitted.

Referring to FIG. 9A, a plurality of first electrodes 11 are arranged in an array on the first substrate 10, and a plurality of step portions 16 are arranged in an array in between adjacent first electrodes 11. Similarly, a plurality of second electrodes 13 are arranged in an array on the second substrate 12, and a plurality of step portions 17 are arranged in an array in between adjacent second electrodes 13.

In the present embodiment, as shown in FIG. 9B, the first substrate 10 and the second substrate 12 are electrically connected to each other through the connectors 21 formed in spaces between the electrodes 11 and 13 arranged in an array, and at the same time, mechanically bonded to each other by the resin 14 led to the space between the step portions 16 and 17 arranged in an array.

According to the present embodiment, the substrate 10 and the substrate 12 are bonded to each other also by the resin 14 led to the space between the step portions 16 and 17 arranged in an array. This can implement a connection between the substrates that is mechanically highly reliable.

EXAMPLES

Examples of the present invention are hereinafter provided to further describe a structure and an effect of the present invention. The present invention is not limited to these examples.

Example 1

A circuit board is used as the first substrate 10, and a semiconductor chip is used as the second substrate 12, to form a flip-chip mounting structure of the circuit board and the semiconductor chip by using the method for connecting between the substrates illustrated in FIG. 1A to FIG. 1D.

The circuit board is a build-up substrate whose size is 10 mm×10 mm and which includes nine electrodes (3×3) having a 100 μmϕ with a pitch of 200 μm. The semiconductor chip is a TEG chip which includes nine electrodes (3×3) having a 100 μmϕ with a pitch of 200 μm.

The step portion 16 having the shape as shown in FIG. 2A is provided on the circuit board. The step portion 16 is made of a solder resist having a width of 4.6 mm and a thickness of 20 μm. A space of 150 μm is left between the edge of the resist and the electrodes. No step portion is provided on the semiconductor chip.

The resin 14 is a mixture of 49% by weight of bisphenol-F type epoxy based resin (Epicoat 806, manufactured by Japan Epoxy Resins Co., Ltd.) containing an imidazole based curing agent (manufactured by SHIKOKU CHEMICALS CORPORATION) and a carboxylic acid based fluxing agent, 50% by weight of a solder powder (SnAgCu: average particle diameter of 30 μm) as the conductive particles 15, and 1% by weight of diethylene glycol dimethyl ether (manufactured by Wako Pure Chemical Industries, Ltd.) as the gas bubble generating agent.

The above resin is applied to the circuit board, and then, the semiconductor chip is located on the circuit board such that the electrodes on the circuit board and the electrodes on the semiconductor chip face each other. At this time, the circuit board and the semiconductor chip are fixed to each other such that the distance $L_1$ between parts of the substrates at which no electrode is formed is 70 μm and that the distance $L_2$ between parts of the substrates at which the step portion is formed is 50 μm.

In this state, the resin is heated to 250° C. so as to melt the solder powder and generate gas bubbles from the gas bubble generating agent. As a result, the solder powder is self-assembled in the space between the electrodes. A connector is formed in the space between the electrodes, and the resin is led to the space between the substrates at which the step portion is formed.

Lastly, the resin is cured so that the circuit board and the semiconductor chip are bonded to each other with the resin led to the space between the substrates at which the step portion is formed.

Example 2

A flip-chip mounting structure in which a circuit board and a semiconductor chip are bonded to each other is formed by using the same method and elements as in Example 1.

The step portion 16 having the shape as shown in FIG. 2A is provided on the circuit board. The step portion 16 is made of a solder resist having a width of 4.4 mm and a thickness of 30 μm. A space of 150 μm is left between the edge of the resist and the electrodes. The step portion 17 having the shape as shown in FIG. 2A is provided on the semiconductor chip. The step portion 17 is formed by a printing method using an acid anhydride based epoxy resin. The step portion 17 has a width of 4.3 mm and a thickness of 15 μm. The step portion 17 is spaced apart from the electrodes by 450 μm. The circuit board and the semiconductor chip are fixed to each other such that the distance $L_1$ between parts of the substrates at which no electrode is formed is 65 μm and that the distance $L_2$ between parts of the substrates at which the step portions are formed is 20 μm, to connect between the substrates.

Example 3

Circuit boards are used as the first substrate 10 and the second substrate 12. The substrates are connected by the connecting method illustrated in FIG. 1A to FIG. 1D.

Each of the circuit boards is a flexible substrate whose size is 10 mm×20 mm and which includes thirty linear electrodes having a width of 50 μm with a pitch of 100 μm.

The step portions 16 and 17 having the shape as shown in FIG. 5A are provided on the circuit boards. The step portions are made of a cover lay film, each having dimensions of 2.5 mm (in a direction orthogonal to the electrodes)×1.5 mm (in a direction parallel to the electrodes) and a thickness of 10 μm. A space of approximately 1 mm is left between the edge of the cover lay film and the electrodes.

The resin is a mixture of 44% by weight of bisphenol-F type epoxy based resin (Epicoat 806, manufactured by Japan Epoxy Resins Co., Ltd.) containing an imidazole based curing agent (manufactured by SHIKOKU CHEMICALS CORPORATION) and a carboxylic acid based fluxing agent, 55% by weight of a solder powder (SnAgCu: particle diameter of 20 μm) as the conductive particles, and 1% by weight of diethylene glycol dimethyl ether (manufactured by Wako Pure Chemical Industries, Ltd.) as the gas bubble generating agent.

The circuit boards are fixed to each other such that the distance $L_1$ between parts of the substrates at which no electrode is formed is 25 μm and that the distance $L_2$ between parts of the substrates at which the step portions are formed is 5 μm, and in this state, the resin is heated to 250° C. to connect between the circuit boards.

Example 4

Circuit boards are connected to each other to form a connection structure between the substrates by using the same method and elements as in Example 3, except that the thickness of each of the first and second circuit boards is 15 μm, that the distance $L_1$ between parts of the substrates at which no electrode is formed is 50 μm, that the distance $L_2$ between parts of the substrates at which the step portions are formed is 20 μm, and that the diameter of the solder powder is 25 μm.

Example 5

Circuit boards are used as the first substrate 10 and the second substrate 12. The substrates are connected by the connecting method illustrated in FIG. 1A to FIG. 1D.

Each of the circuit boards is a flexible substrate whose size is 10 mm×20 mm and which includes twenty linear electrodes having a width of 100 μm with a pitch of 200 μm.

The step portions 16 and 17 having the shape as shown in FIG. 7A are provided on the circuit boards. The step portions are made of a cover lay film, each having dimensions of 10 mm (in a direction orthogonal to the electrodes)×10 mm (in a direction parallel to the electrodes) and a thickness of 15 μm.

The resin is a mixture of 44% by weight of bisphenol-F type epoxy based resin (Epicoat 806, manufactured by Japan Epoxy Resins Co., Ltd.) containing an imidazole based curing agent (manufactured by SHIKOKU CHEMICALS CORPORATION) and a carboxylic acid based fluxing agent, 55% by weight of a solder powder (SnAgCu: particle diameter of 20 μm) as the conductive particles, and 1% by weight of diethylene glycol dimethyl ether (manufactured by Wako Pure Chemical Industries, Ltd.) as the gas bubble generating agent.

The circuit boards are fixed to each other such that the distance $L_1$ between parts of the substrates at which no electrode is formed is 40 μm and that the distance $L_2$ between parts of the substrates at which the step portions are formed is 10 μm, and in this state, the resin is heated to 250° C. to connect between the circuit boards.

Example 6

Figure 10:
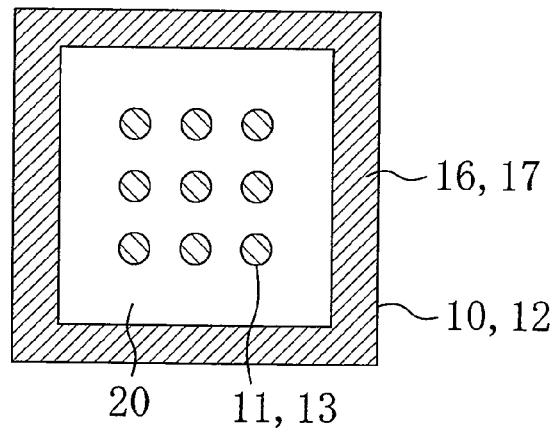
FIG. 10 shows a plan view for illustrating a method for connecting between substrates according to Example 6 of the present invention.

A flip-chip mounting structure in which a circuit board and a semiconductor chip are bonded to each other is formed by using the same method and elements as in Example 1, except that the step portion 16 having the shape as shown in FIG. 2A is replaced with the step portion having the shape as shown in FIG. 10.

Comparative Example 1

A flip-chip mounting structure in which a circuit board and a semiconductor chip are bonded to each other is formed by using the same method and elements as in Example 1, except that the step portions 16 and 17 are not formed on the first substrate 10 and the second substrate 12. The distance $L_1$ between parts of the substrates at which no electrode is formed is set to 60 μm.

Comparative Example 2

Circuit boards are connected to each other to form a connection structure between the substrates by using the same method and elements as in Example 3, except that the step portions 16 and 17 are not formed on the first substrate 10 and the second substrate 12. The distance $L_1$ between parts of the substrates at which no electrode is formed is set to 60 μm.

Major conditions for elements in the flip-chip mounting structure or the connection structure between the substrates (hereinafter simply referred to as "mounting structure") obtained in the above Examples 1 to 6 and Comparative Examples 1 and 2 are shown in FIG. 11.

<<Observation of Cross Sections of Connectors>>

X-ray photographs of the connectors formed in spaces between the electrodes in the mounting structures of Examples 1 to 6 and Comparative Examples 1 and 2 are taken to observe cross sections of the connectors.

The observation result shows that connectors made of a melted solder powder were formed between the electrodes in all of the obtained mounting structures.

In the mounting structures of Example 1 to 6, in which step portions are provided, the resin was led to the step portions, and the circuit board and the semiconductor chip, or two circuit boards, were bonded to each other with the resin.

However, among the resins led to the step portions, the resins in the mounting structures of Examples 2 to 5 include almost no solder powders, whereas the resins in the mounting structures of Examples 1 and 6 include solder powders. This may be because the distance $L_2$ between the step portions, that is 50 μm, is larger than the average particle diameter of the solder powder, that is 30 μm, and therefore, the solder powder came into the space between the step portions, too, in Examples 1 and 6.

In the mounting structures of Examples 2 to 5, hollow parts were formed in the space between parts of the substrates at which no connector is formed. This may be because the distance $L_2$ between the step portions is half or smaller than the distance $L_1$ between parts of the substrates at which no electrode is formed, and therefore, the resin is efficiently led into the space between the step portions in Examples 2 to 5. In the mounting structures of Examples 1 and 6, too, the hollow parts were formed in the space between parts of the substrates at which no connector is formed. However, some resin remained in part of the hollow parts. In contrast, in the mounting structures of Comparative Examples 1 and 2, the resin remained in the space between parts of the substrates at which no connector is formed.

Figure 12A:
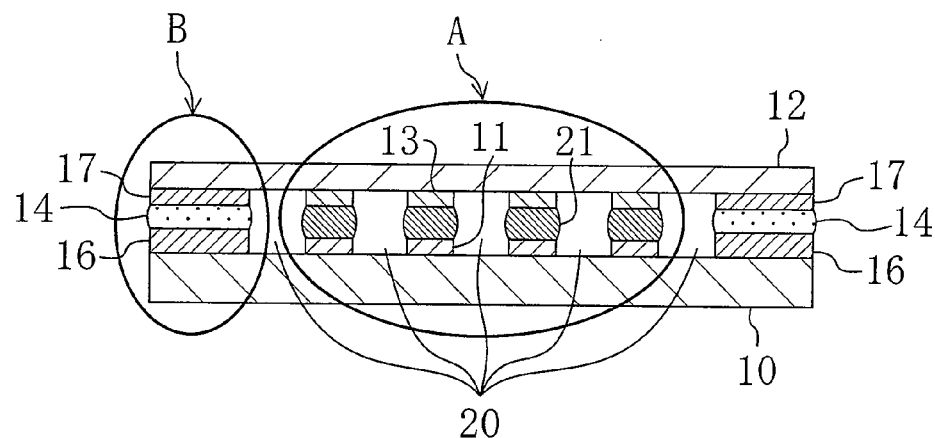
FIG. 12A to FIG. 12C show a result of observation of a cross section of a mounting structure according to Example 4.
Figure 12B:
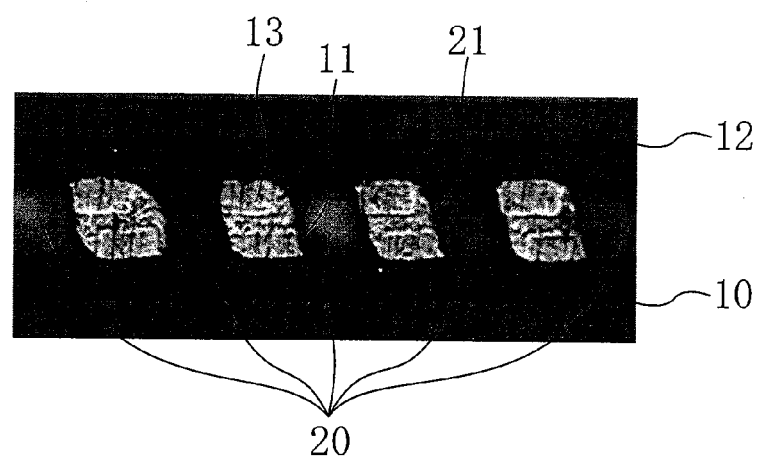
Figure 12C:
Figure 13A:
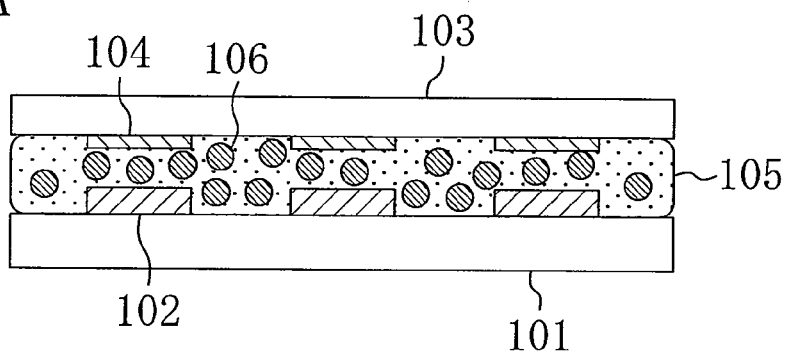
FIG. 13A to FIG. 13D show cross-sectional views for illustrating basic steps of a conventional flip-chip mounting method.
Figure 13B:
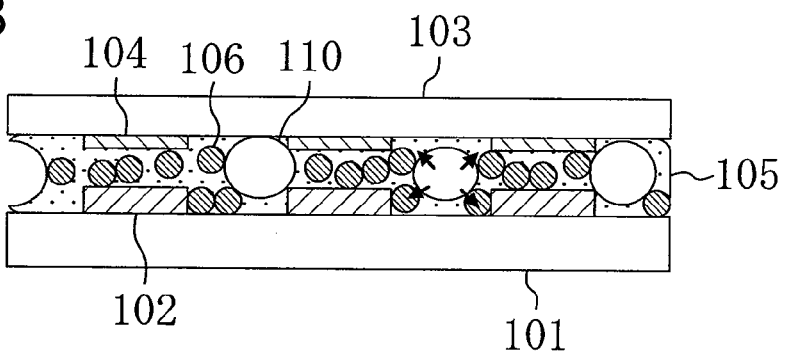
Figure 13C:
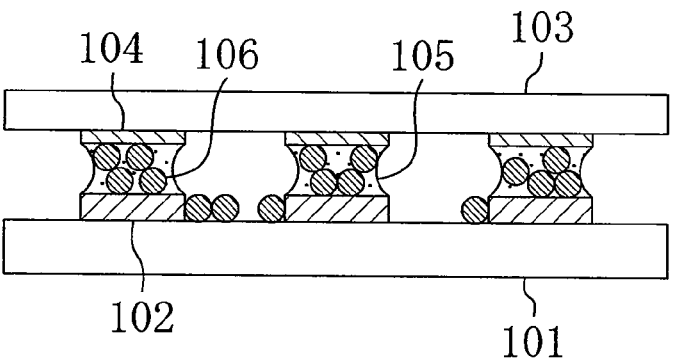
Figure 13D:
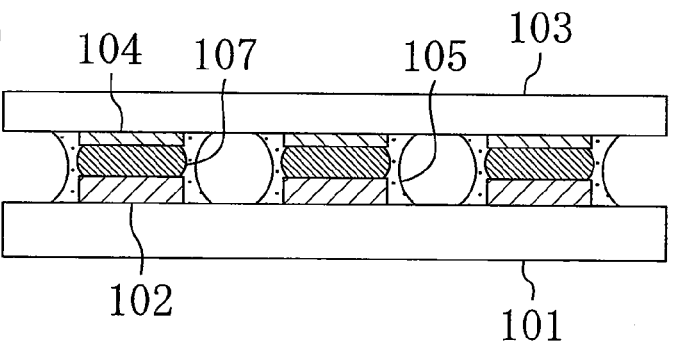

FIG. 12A to FIG. 12C show a result of the observation in which a cross section of a mounting structure of Example 4 is observed. FIG. 12A is a cross-sectional view of the mounting structure. FIG. 12B is an X-ray photograph of a cross section of a part of the mounting structure that is pointed by the arrow A of FIG. 12A. FIG. 12C is an X-ray photograph of a cross section of a part of the mounting structure that is pointed by the arrow B of FIG. 12A.

As shown in FIG. 12B, the connectors 21 made of a melted solder powder are formed in all of the spaces between the electrodes 11 and 13. Moreover, spaces between the circuit board 10 and the circuit board 12 that are not sandwiched between the electrodes 11 and 13 are all hollow parts 20. As shown in FIG. 12C, the resin 14 is led to a space between the step portions 16 and 17, and the circuit board 10 and the circuit board 12 are bonded to each other with the resin.

<<Tests on Reliability>>

A moisture/reflow test and an insulation reliability test were conducted on the mounting structures of Examples 1 to 6 and Comparative Examples 1 and 2. Different wiring layouts from the connectors are used in order to check the connection resistance in the moisture/reflow test, and the insulation resistance in the insulation reliability test.

Conditions of the moisture/reflow test are 85° C./85% RH for 168 hours for moisture soak, and reflow at 240° C. for three times. The result shows that variations in resistance values of the mounting structures of Examples 1 to 5 and Comparative Examples 1 and 2 are within plus or minus 10% after testing, and no problem was found in the appearance after testing. In the mounting structure of Example 6, on the other hand, opens were detected after testing, and expansion of the circuit board was found in the appearance check. This may have happened because the step portion of Example 6 was placed around the periphery of the substrate so as to surround the electrodes, and the hollow part formed in the space between parts of the substrates at which no connector is formed is enclosed by the resin led to the space between parts of the substrates at which the step portion is formed.

The insulation reliability test was conducted under PCT testing conditions (120° C./85% RH, 15 V, 96 hours). The result shows that the resistance value of the mounting structures of Comparative Examples 1 and 2 was decreased to approximately $10^5 \Omega$, and poor insulation between the connectors due to ion migration was found. This may have happened because, in the mounting structures of Comparative Examples 1 and 2, the resin remained between parts of the substrates at which no connector is formed. On the other hand, the mounting structures of Examples 1 to 6 exhibited a resistance value of $10^{10} \Omega$ or more even after testing, and poor insulation due to ion migration was not detected.

The above results show: that the substrates can be electrically connected to each other through the connectors formed in the space between electrodes, by providing step portions at parts on the substrates where no electrode is provided and heating the resin, which is supplied in the space between the substrates and which contains conductive particles and a gas bubble generating agent, to a temperature at which the conductive particles melt; that the connectors can be electrically insulated from one another by the hollow part formed in the space between the substrates that is not sandwiched between the electrodes; and that the distance between the substrates can be fixed with the resin in the space between parts of the substrates at which the step portion is formed. Due to this structure, a highly reliable connection between the substrates can be achieved even if a pitch between the electrodes is narrow.

What is claimed is:

1. A method for connecting between substrates in which a first substrate having a plurality of first electrodes is located so as to face a second substrate having a plurality of second electrodes, the method comprising:

supplying a resin containing conductive particles and a gas bubble generating agent to a space between the first substrate and the second substrate;

heating the resin to melt the conductive particles contained in the resin and generate gas bubbles from the gas bubble generating agent contained in the resin; and curing the resin, wherein a first step portion is formed on the first substrate in a region other than a region where the first electrodes are formed, and a second step portion is formed on the second substrate in a region other than a region where the second electrodes are formed, in the step of heating resin, the resin is pushed aside by the growing gas bubbles, so that the melted conductive particles contained in the resin are led to a space between the first electrodes and the second electrodes and that a connector made of the melted conductive particles is formed in each space between the first electrodes and the second electrodes so that each first electrode is electrically connected to a corresponding second electrode, and the resin is led to a space located in-between the first step portion and the second step portion, and in the step of curing resin, the first substrate and the second substrate are fixed to each other by the cured resin.

2. The method of claim 1, wherein in the step of heating resin, a first hollow part is formed at least in a space between the first substrate and the second substrate that is not sandwiched between the electrodes as a result of the resin being pushed out by the gas bubbles.

3. The method of claim 1, wherein the plurality of first electrodes and the plurality of second electrodes are arranged in an array on the first substrate and the second substrate, respectively, and the first step portion and the second step portion each have a ring shape so as to surround an area where the respective first and second electrodes are arranged in an array.

4. The method of claim 3, wherein an opening is formed in part of the first and second ring-shaped step portions, and as a result of the resin being pushed out by the gas bubble, a second hollow part is formed in a space between part of the first substrate and part of the second substrate at which the first and second ring-shaped step portions have the opening, and the first hollow part communicates with the outside through the second hollow part.

5. The method of claim 1, wherein the plurality of first electrodes and the plurality of second electrodes have a linear shape and are arranged in parallel with each other, and the first step portion and the second step portion are respectively placed outside an area where the corresponding linear-shaped electrodes are located, so as to be parallel with the linear-shaped electrodes.

6. The method of claim 1, wherein the plurality of first electrodes and the plurality of second electrodes have a linear shape and are arranged in parallel with each other, and the first step portion and the second step portion are respectively placed so as to be orthogonal to the corresponding linear-shaped electrodes.

7. The method of claim 1, wherein the first step portion and the second step portion are each made of a material whose wettability to the melted conductive particles is lower than wettability of a material for the first electrodes and the second electrodes to the melted conductive particles.

8. The method of claim 1, wherein a distance between part of the first substrate and part of the second substrate at which the first step portion and the second step portion are respectively formed is smaller than an average particle diameter of the conductive particles.

9. The method of claim 1, wherein a distance between part of the first substrate and part of the second substrate at which the first step portion and the second step portion are respectively formed is half or smaller than a distance between part of the first substrate and part of the second substrate at which the first step portion and the second step portion are respectively not formed.

10. The method of claim 1, wherein a gas bubble generating source for generating gas bubbles is included in at least one of the first substrate and the second substrate instead of including the gas bubble generating agent in the resin, and in the step of heating resin, the gas bubbles are generated from the gas bubble generating source.

11. The method of claim 1, wherein the first substrate and the second substrate are a circuit board or a semiconductor chip.

* * * * *